(12) United States Patent
Chen et al.

(10) Patent No.: US 9,495,304 B2
(45) Date of Patent: Nov. 15, 2016

(54) ADDRESS COMPRESSION METHOD, ADDRESS DECOMPRESSION METHOD, COMPRESSOR, AND DECOMPRESSOR

(71) Applicant: Huawei Technologies Co., Ltd., Shenzhen (CN)

(72) Inventors: Mingyang Chen, Beijing (CN); Mingyu Chen, Beijing (CN); Zehan Cui, Beijing (CN); Yuan Ruan, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1 day.

(21) Appl. No.: 14/687,607

(22) Filed: Apr. 15, 2015

(65) Prior Publication Data

US 2015/0220448 A1 Aug. 6, 2015

Related U.S. Application Data

(63) Continuation of application No. PCT/CN2013/074909, filed on Apr. 27, 2013.

(30) Foreign Application Priority Data

Oct. 15, 2012 (CN) .......................... 2012 1 0390245

(51) Int. Cl.
*G06F 12/00* (2006.01)
*G06F 12/10* (2016.01)
(Continued)

(52) U.S. Cl.
CPC ......... *G06F 12/109* (2013.01); *G06F 9/30138* (2013.01); *G06F 9/35* (2013.01);
(Continued)

(58) Field of Classification Search
CPC ............. G06F 12/109; G06F 12/1045; G06F 9/30138; G06F 9/35; G06F 13/385; G06F 2212/401; G06F 2212/6032; G06F 2212/657; G06F 17/30153
See application file for complete search history.

(56) References Cited

U.S. PATENT DOCUMENTS

2005/0144388 A1 6/2005 Newburn et al.
2005/0146449 A1 7/2005 Adl-Tabatabai et al.
(Continued)

FOREIGN PATENT DOCUMENTS

CN 1543092 A 11/2004
CN 1684104 A 10/2005
(Continued)

OTHER PUBLICATIONS

Foreign Communication From a Counterpart Application, European Application No. 135846476.3, Extended European Search Report, Aug. 6, 2015, 4 pages.
(Continued)

*Primary Examiner* — Shawn X Gu
(74) *Attorney, Agent, or Firm* — Conley Rose, P.C.

(57) ABSTRACT

An address compression method, an address decompression method, a compressor, and a decompressor are disclosed, wherein the address compression method includes after a compressor receives multiple operation request messages that are sent by a first processor, determining, according to an address feature formed by address information carried in all operation request messages that have a same stream number, a compression algorithm corresponding to the operation request messages that have a same stream number; and then compressing, according to the determined compression algorithm, addresses carried in the operation request messages that have a same stream number. The present invention is applicable to the computer field.

17 Claims, 7 Drawing Sheets

(51) Int. Cl.
*G06F 9/30* (2006.01)
*G06F 9/35* (2006.01)
*G06F 13/38* (2006.01)
*G06F 17/30* (2006.01)

(52) U.S. Cl.
CPC ........ *G06F 12/1045* (2013.01); *G06F 13/385* (2013.01); *G06F 17/30153* (2013.01); *G06F 2212/6032* (2013.04); *G06F 2212/657* (2013.01)

(56) References Cited

U.S. PATENT DOCUMENTS

| | | |
|---|---|---|
| 2005/0249008 A1 | 11/2005 | Hsieh |
| 2006/0020772 A1 | 1/2006 | Hussain |
| 2007/0168615 A1 | 7/2007 | Van Eijndhoven et al. |
| 2009/0089507 A1 | 4/2009 | Chen et al. |
| 2010/0088536 A1 | 4/2010 | Lee et al. |
| 2015/0006841 A1 | 1/2015 | Chen et al. |

FOREIGN PATENT DOCUMENTS

| | | |
|---|---|---|
| CN | 1757017 A | 4/2006 |
| CN | 1811733 A | 8/2006 |
| CN | 101398752 A | 4/2009 |
| CN | 101908910 A | 12/2010 |
| CN | 102609378 A | 7/2012 |
| CN | 103729315 A | 4/2014 |
| EP | 2887223 A1 | 6/2015 |
| WO | 2014056178 A1 | 4/2014 |

OTHER PUBLICATIONS

Partial English Translation and Abstract of Chinese Patent Application No. CN101908910, Feb. 4, 2016, 7 pages.
Foreign Communication From a Counterpart Application, Chinese Application No. 201210390245.0, Chinese Office Action dated Dec. 25, 2015, 12 pages.
Partial English Translation and Abstract of Chinese Patent Application No. CN103729315A, 2015, 14 pages.
Doe Hyun, Y., et al., "Adaptive Granularity Memory Systems: A Tradeoff Between Storage Efficiency and Throughput," Proceedings of the 38th Annual International Symposium on Computer Architecture, Jun. 2011, pp. 295-306.
Udipi, A., et al., "Combining Memory and a Controller with Photonics through 3D-Stacking to Enable Scalable and Energy-Efficient Systems," Proceedings of the 38th Annual International Symposium on Computer Architecture, Jun. 4-8, 2011, 12 pages.
Nauman, R., et al., "Effective Management of DRAM Bandwidth in Multicore Processors," 16th International Conference on Parallel Architecture and Compilation Techniques, Sep. 15-19, 2007, 11 pages.
Yuan, X., et al., "Future Memory and Interconnect Technologies," Design, Automation & Test in Europe Conference & Exhibition, Mar. 18-22, 2013, 6 pages.
Chen, L., et al., "MIMS: Towards a Message Interface based Memory System," Journal of Computer Science and Technology, vol. 29, No. 2, 2014, 13 pages.
Foreign Communication From a Counterpart Application, PCT Application No. PCT/CN2013/074909, English Translation of International Search Report dated Aug. 1, 2013, 2 pages.
Foreign Communication From a Counterpart Application, PCT Application No. PCT/CN2013/074909, English Translation of Written Opinion dated Aug. 1, 2013, 10 pages.

ADDRESS COMPRESSION METHOD, ADDRESS DECOMPRESSION METHOD, COMPRESSOR, AND DECOMPRESSOR

CROSS-REFERENCE TO RELATED APPLICATIONS

This application is a continuation of International Application No. PCT/CN2013/074909, filed on Apr. 27, 2013, which claims priority to Chinese Patent Application No. 201210390245.0, filed on Oct. 15, 2012, both of which are hereby incorporated by reference in their entireties.

TECHNICAL FIELD

Embodiments of the present invention relates to the computer field, and in particular, to an address compression method, an address decompression method, a compressor, and a decompressor.

BACKGROUND

Computer components generally use a bus, a path, or a point-to-point connection to transfer a request, a command, data, and the like. When a transferred request or command carries an address, address information accounts for a certain proportion in total transferred information.

Due to locality of a program, an address requested in an execution process of the program presents some spatial or temporal locality. Spatial locality is the addresses that the program requires to access converge in a continuous area, which is manifested as address continuity; and temporal locality is that the program requires access to an address for many times within a period of time, which is manifested as address repeatability.

In the execution process of a program, for each request of the program, if a complete address is transferred over a connection without using a feature of locality according to the program itself, transfer of redundant information, a waste of physical bandwidth, and unnecessary transmission power consumption will result. In addition, for a 32-bit central processing unit (CPU), only addresses of at most 32 bits can be transferred, which leads to maximally fourth generation (4G) system memory and limits the capacity of system memory.

In the prior art, two technologies that use temporal locality or spatial locality to perform address compression are as follows.

(1) Dynamic base register caching technology that uses temporal locality of an address: As shown in FIG. 1, an address sent from processor A to processor B is divided into two parts: a high-order part and a low-order part. The low-order part is directly transferred from processor A to processor B. Before being transferred, the high-order part is searched for in a base register cache of processor A, and if not found, the high-order part is stored in the base register cache, and then a storage location label of the high-order part in the base register cache is transferred to a base register array of processor B; and if the high-order part is found in the base register cache of processor A, a location label of the high-order part in the base register cache is directly transferred to the base register array of processor B. An address stored in a base register cache of processor A keeps synchronized with an address stored in the base register array of processor B. Therefore, after the base register array of processor B receives the location label, the high-order part of the address is found in the base register array according to the location label; and finally, the high-order part is transferred to processor B after being read from the base register array.

Due to address repeatability, a length of the high-order part may be set to be relatively long, so that the location label of the high-order part in the base register cache is shorter than the length of the high-order part; therefore, the technology shortens a length of the transferred address.

(2) Stride address compression technology that uses spatial locality of an address: As shown in FIG. 2, an address sent from processor C to processor D is divided into two parts: a high-order part and a low-order part. Before the address is transferred, a difference between the address and an address stored in base register C is obtained, and then the difference is transferred to processor D at a receiving end, and processor D adds the difference and an address stored in base register D to restore an original address. The address stored in base register C keeps synchronized with the address stored in base register D. Because the difference is generally shorter than the original address, the technology shortens a length of the transferred address.

However, a processed unit of both dynamic base register caching and stride address compression technologies is a request, which results that a compression ratio of a transferred address is still not high.

SUMMARY

Embodiments of the present invention provide an address compression, and address decompression method, a compressor, and a decompressor, which can improve an address compression ratio.

To achieve the foregoing objective, the following technical solutions are adopted in the embodiments of the present invention:

According to a first aspect, an address compression method is provided, and the method includes receiving multiple operation request messages that are sent by a first processor, where each operation request message carries stream number information of a stream to which the operation request message belongs and information about an address at which an operation is performed for the operation request, where the stream number information is used to identify a source that initiates the operation request message; determining, according to an address feature formed by address information carried in all operation request messages that have a same stream number, a compression algorithm corresponding to the operation request messages that have a same stream number; and compressing, according to the determined compression algorithm, addresses carried in the operation request messages that have a same stream number.

In a first possible implementation manner, according to the first aspect, each operation request message further carries size information of data that is requested to be operated; before the determining, according to an address feature formed by address information carried in all operation request messages that have a same stream number, a compression algorithm corresponding to the operation request messages that have a same stream number, the method further includes checking, according to the stream number information, the address information, and the size information that are carried in each operation request message, whether operation request messages that have consecutive addresses exist in the operation request messages that have a same stream number; if operation request messages that have consecutive addresses exist, checking whether attribute information carried in the operation request messages that carry consecutive addresses is completely the same, where the attribute information is other information carried in the operation request messages than the stream number information, the address information, and the size information; and if the attribute information of the operation request messages is completely the same, combining the operation request messages that carry consecutive addresses.

In a second possible implementation manner, according to the first aspect or the first possible implementation manner, after the compressing, according to the determined compression algorithm, addresses carried in the operation request messages that have a same stream number, the method further includes constructing a message packet, where the message packet includes a compressed information part and an uncompressed information part, where the compressed information part includes the compressed addresses, stream number information of operation request messages corresponding to the compressed addresses, and a compression algorithm corresponding to the compressed addresses, and the uncompressed information part includes other information carried in each operation request message than the address information and the stream number information.

In a third possible implementation manner, according to the first aspect, or the first possible implementation manner, or the second possible implementation manner, the operation request messages further carry number information of each operation request message.

According to a second aspect, an address decompression method is provided, and the method includes receiving a message packet that is sent by a first processor, where the message packet includes a compressed information part and an uncompressed information part, where the compressed information part includes compressed addresses, stream number information of operation request messages corresponding to the compressed addresses, and a compression algorithm corresponding to the compressed addresses, and the uncompressed information part includes other information carried in each operation request message than address information and the stream number information, where the operation request messages are messages that the first processor requests a second processor to perform operations, the compressed addresses are addresses obtained after the first processor compresses addresses carried in operation request messages that have a same stream number, and the stream number information is used to identify sources that initiate the operation request messages; parsing the message packet to acquire the compressed addresses and the compression algorithm; determining, according to the compression algorithm, a decompression algorithm corresponding to the compressed addresses; and decompressing the compressed addresses according to the determined decompression algorithm, so that the second processor processes the multiple operation request messages respectively according to decompressed addresses.

In a first possible implementation manner, according to the second aspect, the compressed addresses are addresses obtained after the first processor combines operation request messages that have a same stream number, carry consecutive addresses, and have completely same attribute information of the operation request messages, and then compresses the addresses carried in the operation request messages that have a same stream number.

In a second possible implementation manner, according to the second aspect or the first possible implementation manner, the operation request messages further carry number information of each operation request message.

According to a third aspect, a compressor is provided, where the compressor is configured for address compression, and the compressor includes a receiving unit, a determining unit, and a processing unit, where the receiving unit is configured to receive multiple operation request messages that are sent by a first processor, where each operation request message carries stream number information of a stream to which the operation request message belongs and information about an address at which an operation is performed for the operation request message, where the stream number information is used to identify a source that initiates the operation request message; the determining unit is configured to determine, according to an address feature formed by address information carried in all operation request messages that have a same stream number, a compression algorithm corresponding to the operation request messages that have a same stream number; and the processing unit is configured to compress, according to the determined compression algorithm, addresses carried in the operation request messages that have a same stream number.

In a first possible implementation manner, according to the third aspect, the compressor further includes a check unit; in the multiple operation request messages that are sent by the first processor and received by the receiving unit, each operation request message further carries size information of data that is requested to be operated; the check unit is configured to, before the determining, according to an address feature formed by address information carried in all operation request messages that have a same stream number, a compression algorithm corresponding to the operation request messages that have a same stream number, check, according to the stream number information, the address information, and the size information that are carried in each operation request message, whether operation request messages that have consecutive addresses exist in the operation request messages that have a same stream number; the check unit is further configured to, if operation request messages that have consecutive addresses exist, check whether attribute information carried in the operation request messages that carry consecutive addresses is completely the same, where the attribute information is other information carried in the operation request messages than the stream number information, the address information, and the size information; and the processing unit is further configured to, if the attribute information of the operation request messages is completely the same, combine the operation request messages that carry consecutive addresses.

In a second possible implementation manner, according to the third aspect or the first possible implementation manner, the compressor further includes a constructing unit; the constructing unit is configured to, after the compressing, according to the determined compression algorithm, addresses carried in the operation request messages that have a same stream number, construct a message packet, where the message packet includes a compressed information part and an uncompressed information part, where the compressed information part includes the compressed addresses, stream number information of operation request messages corresponding to the compressed addresses, and a compression algorithm corresponding to the compressed addresses, and the uncompressed information part includes other information carried in each operation request message than the address information and the stream number information.

In a third possible implementation manner, according to the third aspect, or the first possible implementation manner, or the second possible implementation manner, the operation request messages further carry number information of each operation request message.

According to a fourth aspect, a decompressor is provided, where the decompressor is configured for address decompression, and the decompressor includes a receiving unit, a parsing unit, a determining unit, and a processing unit, where the receiving unit is configured to receive a message packet that is sent by a first processor, where the message packet includes a compressed information part and an uncompressed information part, where the compressed information part includes compressed addresses, stream number information of operation request messages corresponding to the compressed addresses, and a compression algorithm corresponding to the compressed addresses, and the uncompressed information part includes other information carried in each operation request message than address information and the stream number information, where the operation request messages are messages that the first processor requests a second processor to perform operations, the compressed addresses are addresses obtained after the first processor compresses addresses carried in operation request messages that have a same stream number, and the stream number information is used to identify sources that initiate the operation request messages; the parsing unit is configured to parse the message packet to acquire the compressed addresses and the compression algorithm; the determining unit is configured to determine, according to the compression algorithm, a decompression algorithm corresponding to the compressed addresses; and the processing unit is configured to decompress the compressed addresses according to the determined decompression algorithm, so that the second processor processes the multiple operation request messages respectively according to decompressed addresses.

In a first possible implementation manner, according to the fourth aspect, the compressed addresses are addresses obtained after the first processor combines operation request messages that have a same stream number, carry consecutive addresses, and have completely same attribute information of the operation request messages, and then compresses the addresses carried in the operation request messages that have a same stream number.

In a second possible implementation manner, according to the fourth aspect, or the first possible implementation manner, or the second possible implementation manner, the operation request messages further carry number information of each operation request message.

According to a fifth aspect, a computer system is provided, where the computer system includes the compressor according to the third aspect or any possible implementation manner of the third aspect and the decompressor according to the fourth aspect or any possible implementation manner of the fourth aspect.

The embodiments of the present invention provide an address compression method, an address decompression method, a compressor, a decompressor, and a computer system. In the compression method, after multiple operation request messages that are sent by a first processor are received, a compression algorithm corresponding to all operation request messages that have a same stream number is determined according to an address feature formed by address information carried in the operation request messages that have a same stream number, and then addresses carried in the operation request messages that have a same stream number are compressed according to the determined compression algorithm. In this way, in the address compression method, during the compression according to the determined compression algorithm, a processed unit is addresses carried in multiple operation request messages that have a same stream number within a time window, which greatly improves an address compression ratio. Accordingly, when the addresses are decompressed, because a decompressor receives addresses that are compressed using the foregoing compression algorithm, a processed unit during the decompression is compressed addresses of multiple operation request messages of a same stream, which also improves the decompression efficiency.

BRIEF DESCRIPTION OF DRAWINGS

To describe the technical solutions in the embodiments of the present invention or in the prior art more clearly, the following briefly introduces the accompanying drawings required for describing the embodiments or the prior art. The accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in embodiments of the present invention with reference to the accompanying drawings in the embodiments of the present invention.

Embodiment 1

Figure 1:
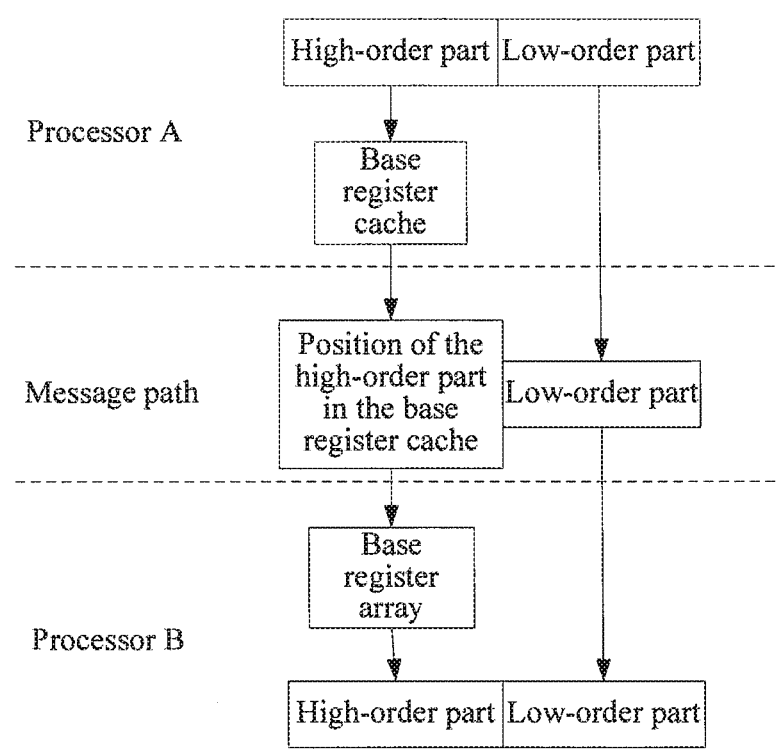
FIG. 1 is a schematic diagram of address compression using temporal locality according to the prior art.
Figure 2:
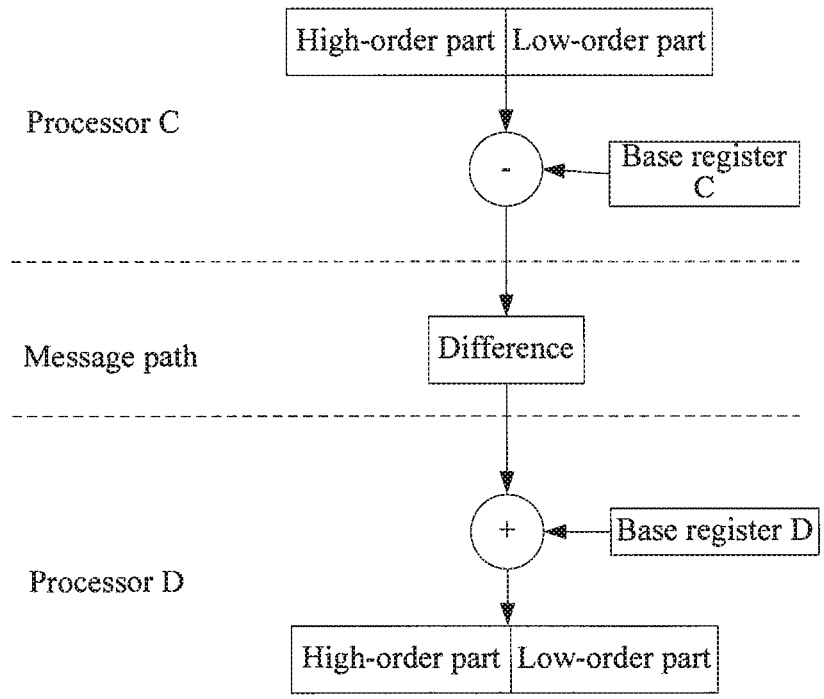
FIG. 2 is a schematic diagram of address compression using spatial locality according to the prior art.
Figure 3:
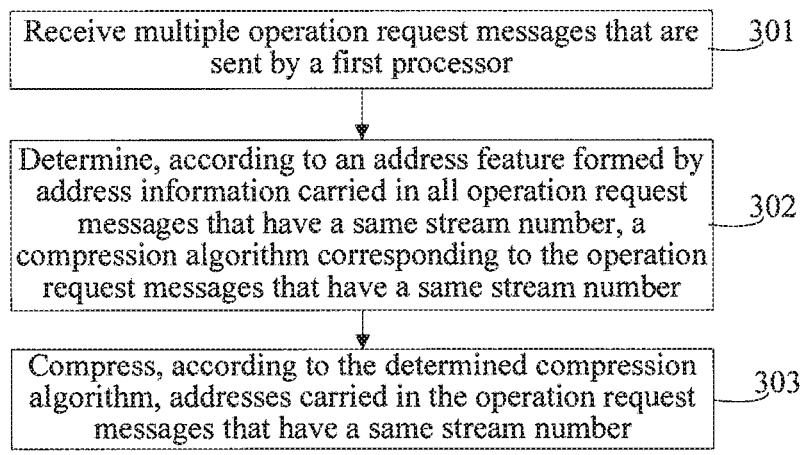
FIG. 3 is a schematic flowchart of an address compression method according to an embodiment of the present invention.

An embodiment of the present invention provides an address compression method, and the method is executed by a compressor. As shown in FIG. 3, the method includes the following steps.

301. Receive multiple operation request messages that are sent by a first processor, where each operation request message carries stream number information of a stream to which the operation request message belongs and information about an address at which an operation is performed for the operation request message, where the stream number information is used to identify a source that initiates the operation request.

The multiple operation request messages are operation request messages that are sent by the first processor within a time window. Stream number information is used to identify a source that initiates an operation request; and different stream number information indicates different sources that initiate operation request messages.

Each operation request message corresponds to an address when an operation is performed, and all requests may be divided into multiple "streams" according to sources. For example, access requests that are transferred on a dynamic random access memory (DRAM) bus may be divided into different streams according to different threads that send the requests. Therefore, each operation request message carries the stream number information of the stream to which the operation request message belongs, and information about an address corresponding to data to be accessed in a second processor.

Certainly, each operation request message further carries other information, such as an operation type of the operation request message, a data domain of the operation request message, size information of data that is requested to be operated, information whether the operation request message is encrypted, and the like. According to different application scenarios, other possible information may be further included, which is not specifically limited in this embodiment.

302. Determine, according to an address feature formed by address information carried in all operation request messages that have a same stream number, a compression algorithm corresponding to the operation request messages that have a same stream number.

The address feature refers to a rule or a characteristic manifested by a group of addresses.

Multiple compression algorithms are pre-stored in the compressor. After the compressor receives the operation request messages that are sent by the first processor, a compression algorithm corresponding to the address feature of the stream is automatically selected according to the address feature formed by the address information carried in all the operation request messages that have a same stream number, so that addresses carried in the operation request messages that have a same stream number are compressed according to the determined compression algorithm.

A reason why the compression algorithm corresponding to the address feature of the stream is selected according to the address feature formed by the address information carried in all the operation request messages that have a same stream number is that a same stream is corresponding to multiple compression algorithms according to different address features of operation request messages. For example, in a batch of operation request messages obtained within a No. 1 time window, addresses of operation request messages that belong to stream 1 are: 0001, 0003, 0005, and 0007; in a batch of operation request messages obtained within a No. 2 time window, addresses of operation request messages that belong to stream 1 are: 0001, 0011, 0021, and 0031; a characteristic manifested by the operation request messages that belong to stream 1 in the No. 1 window is that an interval between adjacent addresses is two units; and a characteristic manifested by the operation request messages that belong to stream 1 in the No. 2 window is that an interval between adjacent addresses is ten units. Therefore, during compression, stream 1 should be corresponding to different compression algorithms.

Certainly, address information carried in operation request messages that belong to a same stream and are obtained within a time window may not have such distinct rules as in the foregoing example, and may manifest another address feature. It is only noted herein that a compression algorithm should be determined according to an address feature formed by address information carried in all operation request messages that have a same stream number. A specific address feature of the address information carried in the operation request messages is not specifically limited in this embodiment of the present invention.

In addition, for two different streams, if address features formed by addresses carried in corresponding operation request messages in the two streams are the same, the two streams may be separately compressed using a same compression algorithm.

303. Compress, according to the determined compression algorithm, addresses carried in the operation request messages that have a same stream number.

Objects corresponding to the compression algorithm are addresses of all operation request messages that belong to a same stream.

A specific compression process is not specifically described or limited in this embodiment of the present invention.

Figure 4:
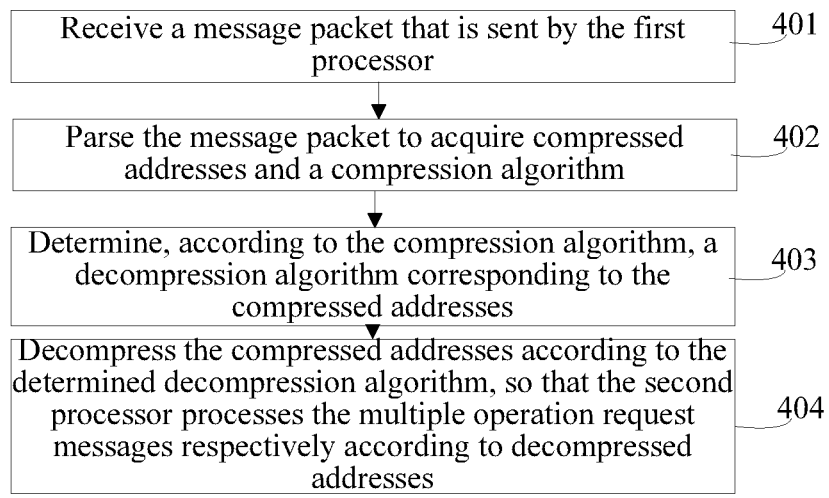
FIG. 4 is a schematic flowchart of an address decompression method according to an embodiment of the present invention.

This embodiment of the present invention further provides an address decompression method, and the method is executed by a decompressor. As shown in FIG. 4, the method includes the following steps.

401. Receive a message packet that is sent by the first processor, where the message packet includes a compressed information part and an uncompressed information part, where the compressed information part includes the compressed addresses, stream number information of operation request messages corresponding to the compressed addresses, and a compression algorithm corresponding to the compressed addresses, and the uncompressed information part includes other information carried in each operation request message than address information and the stream number information, where the operation request messages are messages that the first processor requests a second processor to perform operations, the compressed addresses are addresses obtained after the first processor compresses addresses carried in operation request messages that have a same stream number, and the stream number information is used to identify sources that initiate the operation request messages.

The uncompressed information part includes other information carried in each operation request message than the address information and the stream number information, and the other information includes an operation type of the operation request message, a data domain of the operation request message, size information of data that is requested to be operated, information whether the operation request message is encrypted, and the like. According to different application scenarios, the other information may have multiple possibilities, which is not specifically limited in this embodiment.

402. Parse the message packet to acquire the compressed addresses and the compression algorithm.

This is a process opposite to construction of the message packet, and an objective is to find the compressed addresses and the compression algorithm in information carried in the message packet, so as to further decompress the addresses.

403. Determine, according to the compression algorithm, a decompression algorithm corresponding to the compressed addresses.

Multiple decompression algorithms are pre-stored in the decompressor. After the decompressor receives the operation request messages that are sent by the compressor of the first processor, a decompression algorithm corresponding to the compressed addresses is automatically selected according to the compression algorithm corresponding to the compressed addresses.

If a same compression algorithm is used to compress different streams separately due to a same address feature, the streams are corresponding to a same decompression algorithm in the decompressor.

404. Decompress the compressed addresses according to the determined decompression algorithm, so that the second processor processes the multiple operation request messages respectively according to decompressed addresses.

After the compressed addresses are decompressed, the second processor can process the multiple operation request messages respectively according to the decompressed addresses.

This embodiment of the present invention provides an address compression method and an address decompression method, where, after a compressor receives multiple operation request messages that are sent by a first processor, a compression algorithm corresponding to all operation request messages that have a same stream number is determined according to an address feature formed by address information carried in the operation request messages that have a same stream number, and then addresses carried in the operation request messages that have a same stream number are compressed according to the determined compression algorithm.

In this way, in the address compression method, during the compression according to the determined compression algorithm, a processed unit is addresses carried in multiple operation request messages that have a same stream number within a time window, which greatly improves an address compression ratio. Accordingly, when the addresses are decompressed, because a decompressor receives the addresses that are compressed using the foregoing compression algorithm, a processed unit during the decompression is compressed addresses of multiple operation request messages of a same stream, which also improves the decompression efficiency.

Embodiment 2

Figure 5A:
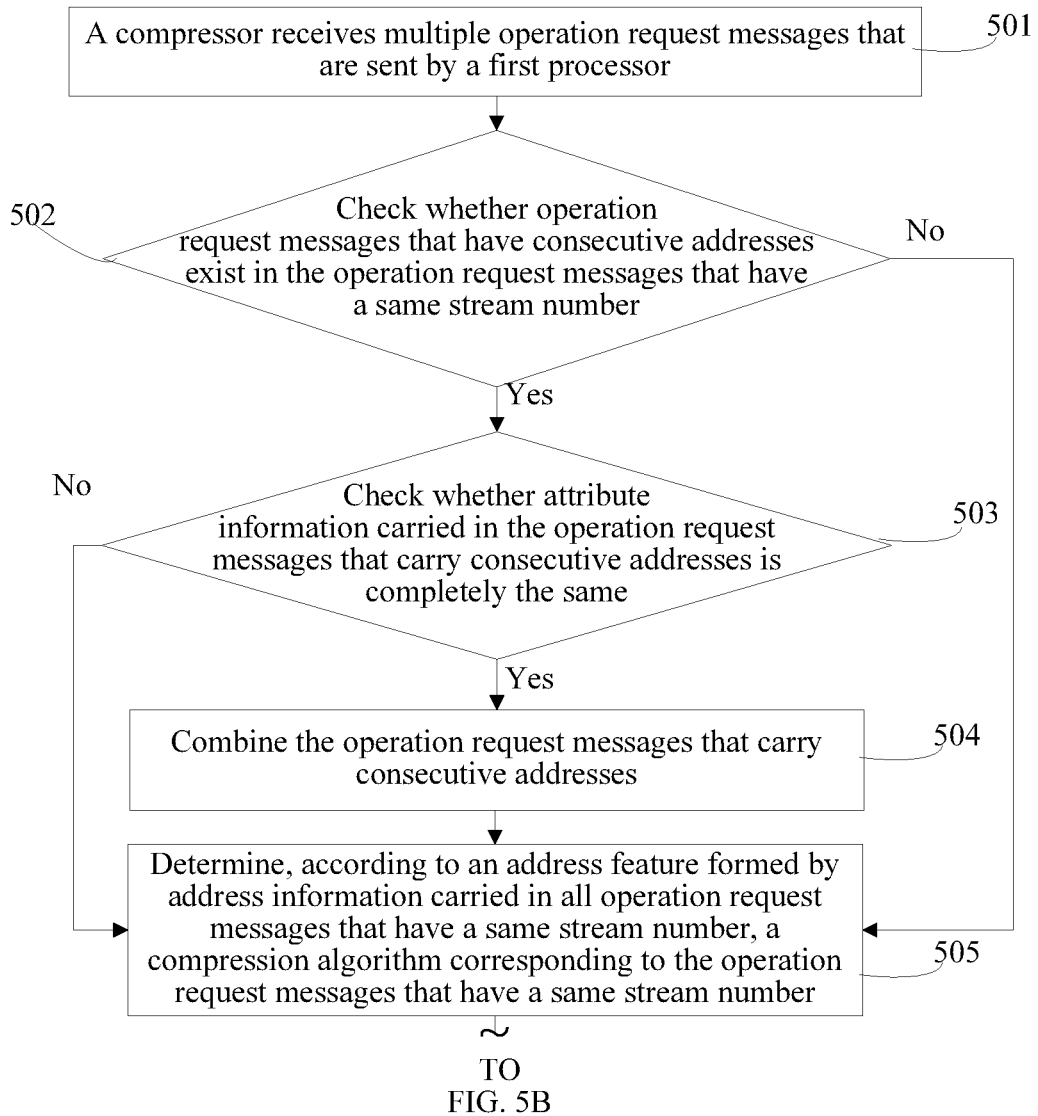
FIG. 5A and FIG. 5B are a schematic flowchart of an address compression and address decompression method according to an embodiment of the present invention.
Figure 5B:
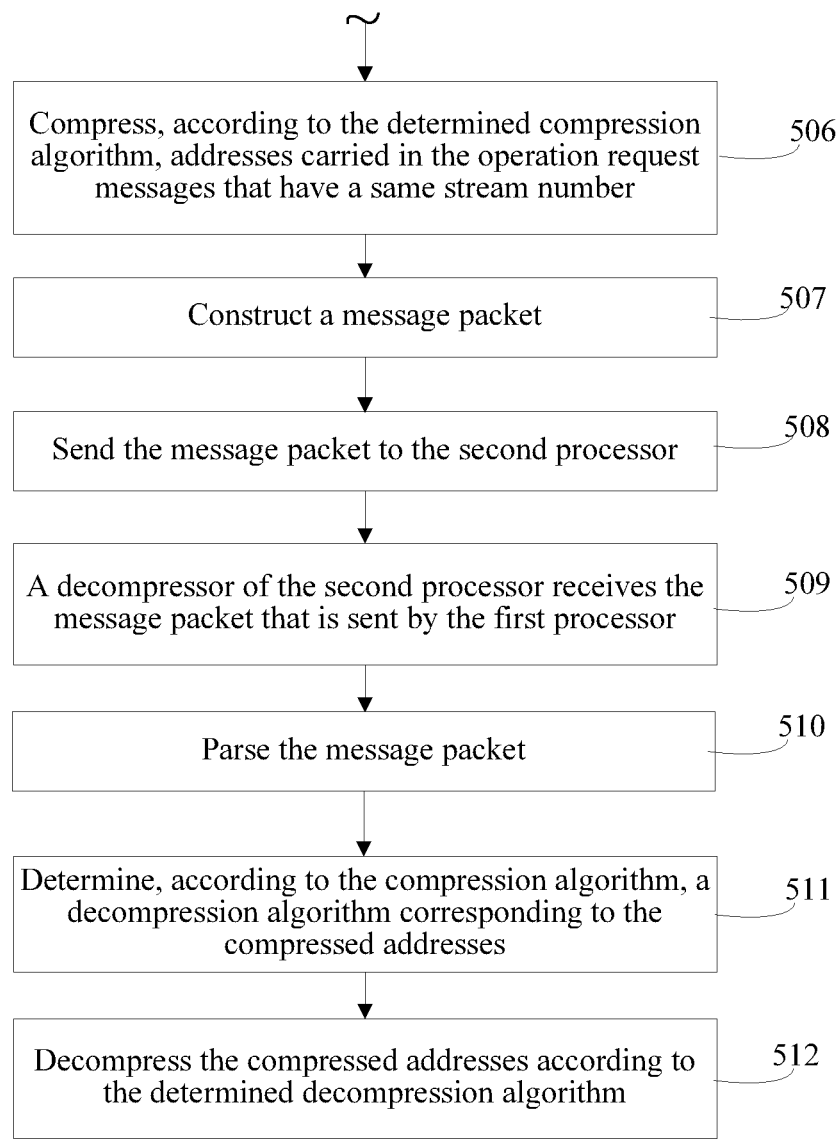

An embodiment of the present invention provides an address compression and decompression method. As shown in FIG. 5A and FIG. 5B, the method includes the following steps.

501. A compressor receives multiple operation request messages that are sent by a first processor, where each operation request message carries stream number information of a stream to which the operation request message belongs, information about an address at which an operation is performed for the operation request message, and size information of data which the operation request message requests to operate, where the stream number information is used to identify a source that initiates the operation request message.

The multiple operation request messages are operation request messages that are sent by the first processor within a time window.

Each operation request message corresponds to an address when an operation is performed, and all requests may be divided into multiple "streams" according to sources. For example, access requests that are transferred on a DRAM bus may be divided into different streams according to different threads that send the requests. Therefore, each operation request message carries the stream number information of the stream to which the operation request message belongs, and the information about the address at which an operation is performed for the operation request message.

Certainly, each operation request message further carries size information of data that is requested to be operated and other information, such as an operation type of the operation request message, a data domain of the operation request message, information whether the operation request message is encrypted, and the like. According to different application scenarios, information carried in each operation request message may be different, which is not specifically limited in this embodiment.

502. Check, according to the stream number information, the address information, and the size information that are carried in each operation request message, whether operation request messages that have consecutive addresses exist in the operation request messages that have a same stream number.

Firstly, the operation request messages that have a same stream number are determined according to the stream number information carried in the operation request messages; in the operation request messages that belong to the same stream number, address information and size information are checked to determine whether the operation request messages are consecutive. For example:

Message A: Address=0001, size=3; Message B: Address=0004, size=5; after the address 0001 moves three bits rightwards, an address pointer points at 0004, that is, $(Address)_A + (Size)_A = (Address)_B$, and therefore it may be determined that addresses of message A and message B are consecutive in this case.

If operation request messages that have consecutive addresses exist, step 503 is performed; if operation request messages that have consecutive addresses do not exist, step 505 is performed.

503. If operation request messages that have consecutive addresses exist, check whether attribute information carried in the operation request messages that carry consecutive addresses is completely the same.

Generally, information carried in each operation request message is divided into two parts: one is information about data that is requested to be operated, and the other is attribute information of the operation request message, where address information corresponding to the data that is requested to be operated, the size information of the data that is requested to be operated, and the data domain that requests to be operated belong to the information about the data that is requested to be operated, and information about a stream number to which the operation request message belongs, the operation type of the operation request message, and the information whether the operation request message is encrypted belong to the attribute information of the operation request message. According to different application scenarios, the attribute information may have multiple possibilities, which is not specifically limited in this embodiment.

If the attribute information is completely the same, step 504 is performed; if the attribute information is not completely the same, the operation request messages that have a same stream number cannot be combined even if the addresses are consecutive, and in this case, step 505 is then performed.

504. If the attribute information is completely the same, combine the operation request messages that carry consecutive addresses.

In the foregoing example, it is determined that the addresses of message A and message B are consecutive, and it is assumed that other attribute information than Size and Address in message A and message B is completely the same. In this case, message A and message B may be combined into one message, that is, message C: Address=0001, size=8, after the combination, when a message packet is transferred to a decompressor after address compression, repeated transmission of the attribute information can be reduced, thereby improving a compression ratio and transmission efficiency.

505. Determine, according to an address feature formed by address information carried in all operation request messages that have a same stream number, a compression algorithm corresponding to the operation request messages that have a same stream number.

The address feature refers to a rule or a characteristic manifested by a group of addresses.

Multiple compression algorithms are pre-stored in the compressor. After the compressor receives the operation request messages that are sent by the first processor, a compression algorithm corresponding to the address feature of the stream is automatically selected according to the address feature formed by the address information carried in all the operation request messages that have a same stream number, so that addresses carried in the operation request messages that have a same stream number are compressed according to the determined compression algorithm.

A reason why the compression algorithm corresponding to the address feature of the stream is selected according to the address feature formed by the address information carried in all the operation request messages that have a same stream number is that a same stream is corresponding to multiple compression algorithms according to different address features of operation request messages. For example, in a batch of operation request messages obtained within a No. 1 time window, addresses of operation request messages that belong to stream 1 are: 0001, 0003, 0005, and 0007; in a batch of operation request messages obtained within a No. 2 time window, addresses of operation request messages that belong to stream 1 are: 0001, 0011, 0021, and 0031; a characteristic manifested by the operation request messages that belong to stream 1 in the No. 1 window is that an interval between adjacent addresses is two units; a characteristic manifested by the operation request messages that belong to stream 1 in the No. 2 window is that an interval between adjacent addresses is ten units. Therefore, during compression, stream 1 should be corresponding to different compression algorithms.

Certainly, address information carried in operation request messages that belong to a same stream and are obtained within a time window may not have such distinct rules as the foregoing example, and may manifest another address feature. It is only noted herein that a compression algorithm should be determined according to an address feature formed by address information carried in all operation request messages that have a same stream number. A specific address feature of the address information carried in the operation request messages is not specifically limited in this embodiment of the present invention.

In addition, for two different streams, if address features formed by addresses carried in corresponding operation request messages in the two streams are the same, the two streams may be separately compressed using a same compression algorithm.

506. Compress, according to the determined compression algorithm, addresses carried in the operation request messages that have a same stream number.

Objects corresponding to the compression algorithm are addresses of all operation request messages that belong to a same stream.

A specific compression process is not specifically described or limited in this embodiment of the present invention.

507. Construct a message packet, where the message packet includes a compressed information part and an uncompressed information part, where the compressed information part includes the compressed addresses, stream number information of operation request messages corresponding to the compressed addresses, and a compression algorithm corresponding to the compressed addresses, and the uncompressed information part includes other information carried in each operation request message than the address information and the stream number information.

The so-called packet herein is a logic concept, which indicates that two parts in the packet are associated. Therefore, the message packet is constructed, so as to make the attribute information of the operation request messages better correspond to compression information and the size information, thereby ensuring accuracy of transmitted information.

The uncompressed information part includes other information carried in each operation request message than the address information and the stream number information, and the other information includes an operation type of the operation request message, a data domain of the operation request message, size information of data that is requested to be operated, information whether the operation request message is encrypted, and the like. According to different application scenarios, the other information further includes other information, which is not specifically limited in this embodiment.

508. Send the message packet to a second processor.

Whether the message packet is sent to the second processor in a bus manner or a point-to-point manner is not specifically limited in this embodiment.

509. A decompressor of the second processor receives the message packet that is sent by the first processor, where the message packet includes the compressed information part and the uncompressed information part, where the compressed information part includes the compressed addresses, stream number information of operation request messages corresponding to the compressed addresses, and a compression algorithm corresponding to the compressed addresses, and the uncompressed information part includes other information carried in each operation request message than the address information and the stream number information.

The message packet that is sent by the first processor and received by the decompressor of the second processor is the message packet constructed in step 507, and details are not described herein again.

510. Parse the message packet to acquire the compressed addresses and the compression algorithm.

This is a process opposite to construction of the message packet, and an objective is to find the compressed addresses and the compression algorithm in information carried in the message packet, so as to further decompress the addresses.

511. Determine, according to the compression algorithm, a decompression algorithm corresponding to the compressed addresses.

Multiple decompression algorithms are pre-stored in the decompressor, after the decompressor receives the operation request messages that are sent by the compressor of the first processor, a decompression algorithm corresponding to the compressed addresses is automatically selected according to the compression algorithm corresponding to the compressed addresses.

If a same compression algorithm is used to compress different streams separately due to a same address feature, the streams are corresponding to a same decompression algorithm in the decompressor.

512. Decompress the compressed addresses according to the determined decompression algorithm, so that the second processor processes the multiple operation request messages respectively according to decompressed addresses.

After the compressed addresses are decompressed, the second processor may process the multiple operation request messages respectively according to the decompressed addresses.

When some processors at a receiving end process the operation request messages, there is a strict stipulation on a processing sequence of the operation request messages, and it is stipulated that the processing is performed according to a sending sequence at a sending end. In this case, optionally, when the compressor receives the multiple operation request messages that are sent by the first processor, each operation request message further carries number information of each operation request message; when the second processor processes the multiple operation request messages respectively according to the decompressed addresses, the operation request messages are sequentially processed according to a sequence of numbers carried in the operation request messages.

This embodiment of the present invention provides an address compression and decompression method. After a compressor receives multiple operation request messages that are sent by a first processor, a compression algorithm corresponding to all operation request messages that have a same stream number is determined according to an address feature formed by address information carried in the operation request messages that have a same stream number, and then addresses carried in the operation request messages that have a same stream number are compressed according to the determined compression algorithm.

In this way, in the address compression method, during the compression according to the determined compression algorithm, a processed unit is addresses carried in multiple operation request messages that have a same stream number within a time window, which greatly improves an address compression ratio. Accordingly, when the addresses are decompressed, because a decompressor receives the addresses that are compressed using the foregoing compression algorithm, a processed unit during the decompression is compressed addresses of multiple operation request messages of a same stream, which also improves the decompression efficiency.

Embodiment 3

Figure 6:
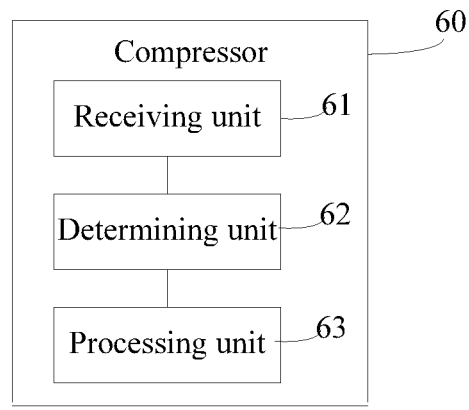
FIG. 6 is a schematic structural diagram of a compressor according to an embodiment of the present invention.

As shown in FIG. 6, an embodiment of the present invention provides a compressor 60, where the compressor 60 is configured for address compression, and the compressor 60 includes a receiving unit 61, a determining unit 62, and a processing unit 63.

The receiving unit 61 is configured to receive multiple operation request messages that are sent by a first processor, where each operation request message carries stream number information of a stream to which the operation request message belongs and information about an address at which an operation is performed for the operation request message, where the stream number information is used to identify a source that initiates the operation request message.

The multiple operation request messages are operation request messages that are sent by the first processor within a time window.

Each operation request message corresponds to an address when an operation is performed, and all requests may be divided into multiple "streams" according to sources. For example, access requests that are transferred on a DRAM bus may be divided into different streams according to different threads that send the requests. Therefore, each operation request message carries the stream number information of the stream to which the operation request message belongs, and information about an address corresponding to data to be accessed in a second processor.

Certainly, each operation request message further carries other information, such as an operation type of the operation request message, a data domain of the operation request message, size information of data that is requested to be operated, information whether the operation request message is encrypted, and the like. According to different application scenarios, multiple types of other possible information may be further included, which is not specifically limited in this embodiment.

The determining unit 62 is configured to determine, according to an address feature formed by address information carried in all operation request messages that have a same stream number, a compression algorithm corresponding to the operation request messages that have a same stream number.

The address feature refers to a rule or a characteristic manifested by a group of addresses.

Multiple compression algorithms are pre-stored in the compressor, after the compressor receives the operation request messages that are sent by the first processor, a compression algorithm corresponding to the address feature of the stream is automatically selected according to the address feature formed by the address information carried in all the operation request messages that have a same stream number, so that addresses carried in the operation request messages that have a same stream number are compressed according to the determined compression algorithm.

A reason why the compression algorithm corresponding to the address feature of the stream is selected according to the address feature formed by the address information carried in all the operation request messages that have a same stream number is that a same stream is corresponding to multiple compression algorithms according to different address features of operation request messages. For example, in a batch of operation request messages obtained within a No. 1 time window, addresses of operation request messages that belong to stream 1 are: 0001, 0003, 0005, and 0007; in a batch of operation request messages obtained within a No. 2 time window, addresses of operation request messages that belong to stream 1 are: 0001, 0011, 0021, and 0031; a characteristic manifested by the operation request messages that belong to stream 1 in the No. 1 window is that an interval between adjacent addresses is two units; a characteristic manifested by the operation request messages that belong to stream 1 in the No. 2 window is that an interval between adjacent addresses is ten units. Therefore, during compression, stream 1 should be corresponding to different compression algorithms.

Certainly, address information carried in operation request messages that belong to a same stream and are obtained within a time window may not have such distinct rules as the foregoing example, and may manifest another address feature. It is only noted herein that a compression algorithm should be determined according to an address feature formed by address information carried in all operation request messages that have a same stream number. A specific address feature of the address information carried in the operation request messages is not specifically limited in this embodiment of the present invention.

In addition, for two different streams, if address features formed by addresses carried in corresponding operation request messages in the two streams are the same, the two streams may be separately compressed using a same compression algorithm.

The processing unit 63 is configured to compress, according to the determined compression algorithm, addresses carried in the operation request messages that have a same stream number.

Objects corresponding to the compression algorithm are addresses of all operation request messages that belong to a same stream.

A specific compression process is not specifically described or limited in this embodiment of the present invention.

Figure 7:
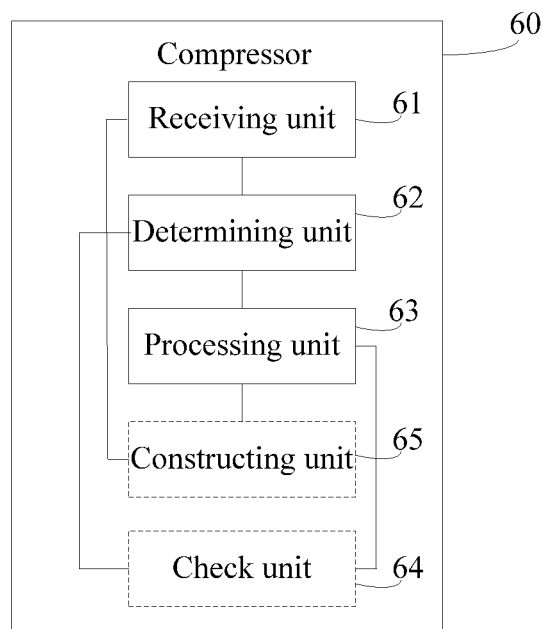
FIG. 7 is a schematic structural diagram of another compressor according to an embodiment of the present invention.

Optionally, as shown in FIG. 7, the compressor 60 may further include a check unit 64.

In the multiple operation request messages that are sent by the first processor and received by the receiving unit 61, each operation request message further carries size information of data that is requested to be operated.

The check unit 64 is configured to, before the determining, according to an address feature formed by address information carried in all operation request messages that have a same stream number, a compression algorithm corresponding to the operation request messages that have a same stream number, check, according to the stream number information, the address information, and the size information that are carried in each operation request message, whether operation request messages that have consecutive addresses exist in the operation request messages that have a same stream number.

Firstly, the operation request messages that have a same stream number are determined according to the stream number information carried in the operation request messages; in the operation request messages that belong to the same stream number, address information and size information are checked to determine whether the operation request messages are consecutive. For example:

Message A: Address=0001, size=3; Message B: Address=0004, size=5; after the address 0001 moves three bits rightwards, an address pointer points at 0004, that is, $(Address)_A + (Size)_A = (Address)_B$, and therefore it may be determined that addresses of message A and message B are consecutive in this case.

The check unit 64 is further configured to, if operation request messages that have consecutive addresses exist, check whether attribute information carried in the operation request messages that carry consecutive addresses is completely the same.

Generally, a message carried in each operation request message is divided into two parts. One is information about data that is requested to be operated, and the other is attribute information of the operation request message, where address information corresponding to the data that is requested to be operated, the size information of the data that is requested to be operated, and the data domain that requests to be operated belong to the information about the data that is requested to be operated, and information about a stream number to which the operation request message belongs, the operation type of the operation request message, and the information whether the operation request message is encrypted belong to the attribute information of the operation request message. According to different application scenarios, the attribute information may further include other information, which is not specifically limited in this embodiment.

If the attribute information is completely the same, the operation request messages that have consecutive addresses may be combined; otherwise, the combination cannot be performed.

The processing unit 63 is further configured to, if the attribute information of the operation request messages is completely the same, combine the operation request messages that carry consecutive addresses.

In the foregoing example, it is determined that the addresses of message A and message B are consecutive, and it is assumed that other attribute information than Size and Address in message A and message B is completely the same. In this case, message A and message B may be combined into one message, that is, message C: Address=0001, size=8, after the combination, when a message packet is transferred to a decompressor after address compression, repeated transmission of the attribute information can be reduced, thereby improving a compression ratio and transmission efficiency.

Optionally, as shown in FIG. 7, the compressor 60 may further include a constructing unit 65.

The constructing unit 65 is configured to, after the compressing, according to the determined compression algorithm, addresses carried in the operation request messages that have a same stream number, construct a message packet, where the message packet includes a compressed information part and an uncompressed information part, where the compressed information part includes the compressed addresses, stream number information of operation request messages corresponding to the compressed addresses, and a compression algorithm corresponding to the compressed addresses, and the uncompressed information part includes other information carried in each operation request message than the address information and the stream number information.

The so-called packet herein is a logic concept, which indicates that two parts in the packet are associated. Therefore, the message packet is constructed, so as to make the attribute information of the operation request messages better correspond to compression information and the size information, thereby ensuring accuracy of transmitted information.

The uncompressed information part includes other information carried in each operation request message than the address information and the stream number information, and the other information includes an operation type of the operation request message, a data domain of the operation request message, size information of data that is requested to be operated, information whether the operation request message is encrypted, and the like. According to different application scenarios, the other information may further include other information, which is not specifically limited in this embodiment.

When some processors at a receiving end process the operation request messages, there is a strict stipulation on a processing sequence of the operation request messages, and it is stipulated that the processing is performed according to a sending sequence at a sending end. In this case, optionally, when the receiving unit 61 receives the multiple operation request messages that are sent by the first processor, the operation request messages further carry number information of each operation request message.

The number information of each operation request message carried in the operation request messages is one type of the attribute information.

This embodiment of the present invention provides a compressor, where the compressor includes a receiving unit, a determining unit, and a processing unit. After the receiving unit receives multiple operation request messages that are sent by a first processor, the determining unit determines, according to an address feature formed by address information carried in all operation request messages that have a same stream number, a compression algorithm corresponding to the operation request messages that have a same stream number, and then the processing unit compresses, according to the determined compression algorithm, addresses carried in the operation request messages that have a same stream number.

In this way, when the compressor compresses the addresses according to the determined compression algorithm, a processed unit during the compression is addresses carried in multiple operation request messages that have a same stream number within a time window, which greatly improves an address compression ratio.

Embodiment 4

Figure 8:
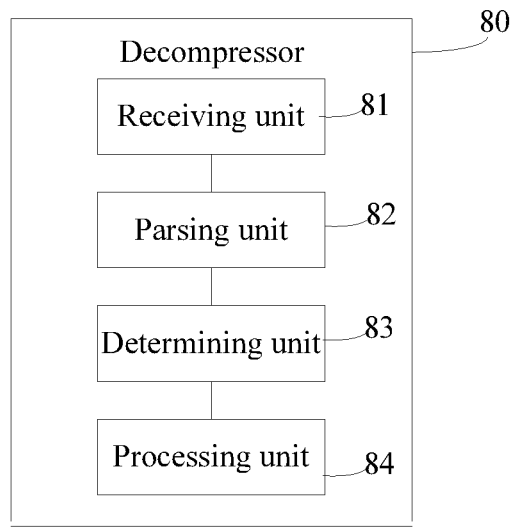
FIG. 8 is a schematic structural diagram of a decompressor according to an embodiment of the present invention.

An embodiment of the present invention provides a decompressor 80. As shown in FIG. 8, the decompressor 80 is configured for address decompression, and the decompressor 80 includes a receiving unit 81, a parsing unit 82, a determining unit 83, and a processing unit 84.

The receiving unit 81 is configured to receive a message packet that is sent by a first processor, where the message packet includes a compressed information part and an uncompressed information part, where the compressed information part includes compressed addresses, stream number information of operation request messages corresponding to the compressed addresses, and a compression algorithm corresponding to the compressed addresses, and the uncompressed information part includes other information carried in each operation request message than address information and the stream number information, where the operation request messages are messages that the first processor requests a second processor to perform operations, the compressed addresses are addresses obtained after the first processor compresses addresses carried in operation request messages that have a same stream number, and the stream number information is used to identify sources that initiate the operation request messages.

The uncompressed information part includes other information carried in each operation request message than the address information and the stream number information, and the other information includes an operation type of the operation request message, a data domain of the operation request message, size information of data that is requested to be operated, information whether the operation request message is encrypted, and the like. According to different application scenarios, the other information may have multiple possibilities, which is not specifically limited in this embodiment.

The parsing unit 82 is configured to parse the message packet to acquire the compressed addresses and the compression algorithm.

This is a process opposite to construction of the message packet, and an objective is to find the compressed addresses and the compression algorithm in information carried in the message packet, so as to further decompress the addresses.

The determining unit 83 is configured to determine, according to the compression algorithm, a decompression algorithm corresponding to the compressed addresses.

Multiple decompression algorithms are pre-stored in the decompressor 80, after the receiving unit 81 receives the operation request messages that are sent by the compressor of the first processor, a decompression algorithm corresponding to the compressed addresses is automatically selected according to the compression algorithm corresponding to the compressed addresses.

If a same compression algorithm is used to compress different streams separately due to a same address feature, the streams are corresponding to a same decompression algorithm in the decompressor.

The processing unit 84 is configured to decompress the compressed addresses according to the determined decompression algorithm, so that the second processor processes the multiple operation request messages respectively according to decompressed addresses.

After the compressed addresses are decompressed, the second processor may process the multiple operation request messages respectively according to the decompressed addresses.

Optionally, the compressed addresses are addresses obtained after the first processor combines operation request messages that have a same stream number, carry consecutive addresses, and have completely same attribute information of the operation request messages, and then compresses the addresses carried in the operation request messages that have a same stream number.

Optionally, the operation request messages further carry number information of each operation request message.

When some processors at a receiving end process the operation request messages, there is a strict stipulation on a processing sequence of the operation request messages, and it is stipulated that the processing is performed according to a sending sequence at a sending end. In this case, when the receiving unit 61 of the compressor 60 receives the multiple operation request messages that are sent by the first processor, each operation request message further carries number information of the operation request message, and when the receiving unit 81 of the decompressor 80 of the second processor receives the multiple operation request messages that carry the compressed addresses and are sent by the first processor, number information of each operation request message is also carried; in this way, when the multiple operation request messages are processed respectively according to the decompressed addresses, the operation request messages may be sequentially processed according to a sequence of numbers carried in the operation request messages.

This embodiment of the present invention provides a decompressor, where the decompressor includes a receiving unit, a determining unit, and a processing unit. After the receiving unit receives multiple operation request messages that are sent by the first processor, the determining unit determines, according to a compression algorithm corresponding to the compressed addresses, a decompression algorithm corresponding to the compressed addresses; finally, the processing unit decompresses the compressed addresses according to the determined decompression algorithm, so that the second processor processes the multiple operation request messages respectively according to the decompressed addresses.

In this way, when the decompressor decompresses the addresses, because the decompressor receives the addresses that are compressed by the compressor described in Embodiment 3, a processed unit during the decompression is compressed addresses of multiple operation request messages of a same stream, which also improves the decompression efficiency.

The compressor and the decompressor in the foregoing embodiments may be separately located in computer processors.

Embodiment 5

Figure 9:
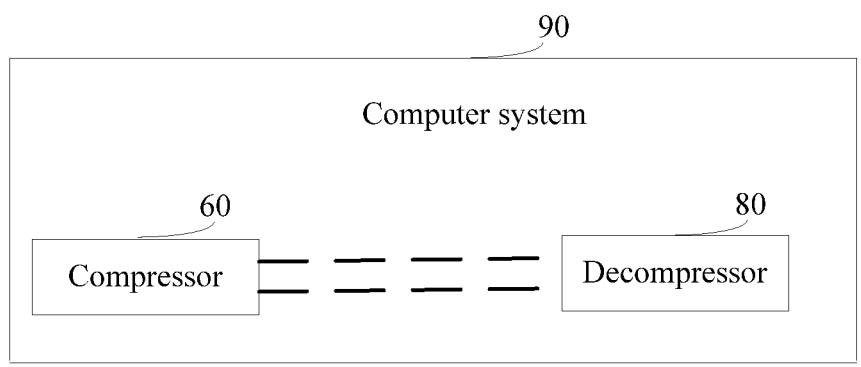
FIG. 9 is a schematic diagram of a computer system according to an embodiment of the present invention.

An embodiment of the present invention further provides a computer system 90. As shown in FIG. 9, the computer system includes the compressor 60 and the decompressor 80.

After the compressor 60 completes a task of performing address compression on multiple operation request messages and sends the operation request messages that carry compressed addresses to the decompressor 80, the decompressor 80 then performs a corresponding decompression task. For a specific compression and decompression process, refer to descriptions in Embodiment 1 or 2; in this embodiment of the present invention, details are not described herein again.

This embodiment of the present invention provides a computer system, where the computer system includes the compressor described in Embodiment 1 or 3 and the decompressor described in Embodiment 1 or 4; when the compressor described in Embodiment 3 compresses addresses according to a determined compression algorithm, a processed unit during the compression is addresses carried in multiple operation request messages that have a same stream number within a time window, which greatly improves an address compression ratio. Accordingly, when the decompressor described in Embodiment 4 decompresses the addresses, because the decompressor receives the addresses that are compressed by the compressor described in Embodiment 3, a processed unit during the decompression is compressed addresses of multiple operation request messages of a same stream, which also improves the decompression efficiency.

A person of ordinary skill in the art may understand that all or a part of the steps of the method embodiments may be implemented by a program instructing relevant hardware. The program may be stored in a computer readable storage medium. When the program runs, the steps of the method embodiments are performed. The foregoing storage medium includes any medium that can store program code, such as a read-only memory (ROM), a random access memory (RAM), a magnetic disk, or an optical disc.

The foregoing descriptions are merely specific implementation manners of the present invention, and are not intended to limit the protection scope of the present invention. Any variation or replacement readily figured out by a person skilled in the art within the technical scope disclosed in the embodiments of the present invention shall fall within the protection scope of the present invention. Therefore, the protection scope of the embodiments of the present invention shall be subject to the protection scope of the claims.

What is claimed is:

1. A method for compressing addresses in operation request messages in a computer system, wherein the computer system comprises a first computer component and a second computer component, the method comprising:

receiving multiple operation request messages that are sent by the first computer component, wherein each operation request message carries identification information of the first computer component and an address to be accessed in the second computer component, and wherein the identification information is used to identify sources that initiate the operation request messages;

determining a compression algorithm corresponding to the multiple operation request messages according to the addresses carried in the multiple operation request messages that have a same identification information;

compressing, according to the compression algorithm, the addresses carried in the multiple operation request messages that have the same identification information; and sending the multiple operation request messages to the second computer component after the addresses carried in the multiple operation request messages have been compressed.

2. The method according to claim 1, wherein each operation request message further carries size information of data that is requested to be operated, and wherein, before determining the compression algorithm corresponding to the multiple operation request messages according to the addresses carried in the multiple operation request messages that have the same identification information, the method further comprises:

checking, according to the identification information, the address, and the size information that are carried in each operation request message, whether operation request messages that carry consecutive addresses exist in the multiple operation request messages that have the same identification information;

checking whether attribute information carried in the operation request messages that carry consecutive addresses is the same when operation request messages that carry consecutive addresses exist; and combining the operation request messages that carry consecutive addresses when the attribute information of the operation request messages that carry consecutive addresses is the same.

3. The method according to claim 2, wherein, after compressing, according to the compression algorithm, the addresses carried in the multiple operation request messages that have the same identification information, sending the multiple operation request messages to the second computer component after the addresses carried in the multiple operation request messages have been compressed further comprises:

constructing a message packet, wherein the message packet comprises a compressed information part and an uncompressed information part, wherein the compressed information part comprises the compressed addresses, stream number information of operation request messages corresponding to the compressed addresses, and the compression algorithm corresponding to the compressed addresses, and wherein the uncompressed information part comprises other information carried in each operation request message than the address information and the stream number information; and sending the message packet to the second computer component.

4. The method according to claim 1, wherein, after compressing, according to the compression algorithm, the addresses carried in the multiple operation request messages that have the same identification information, sending the multiple operation request messages to the second computer component after the addresses carried in the multiple operation request messages have been compressed further comprises:
  constructing a message packet, wherein the message packet comprises a compressed information part and an uncompressed information part, wherein the compressed information part comprises the compressed addresses, stream number information of operation request messages corresponding to the compressed addresses, and the compression algorithm corresponding to the compressed addresses, and wherein the uncompressed information part comprises other information carried in each operation request message than the address information and the stream number information; and
  sending the message packet to the second computer component.

5. The method according to claim 1, wherein the operation request messages further carry number information of each operation request message.

6. A method of decompressing addresses in operation request messages in a computer system, wherein the computer system comprises a first computer component and a second computer component, the method comprising:
  receiving a message packet, wherein the message packet comprises a compressed information part and an uncompressed information part, wherein the compressed information part comprises compressed addresses, identification information of the first computer component corresponding to the compressed addresses, and a compression algorithm corresponding to the compressed addresses, wherein the uncompressed information part comprises other information carried in each operation request message than address and the identification information, wherein the operation request messages are messages indicating operations that the first computer component requests the second computer component to perform, wherein the compressed addresses are addresses obtained after the first computer component compresses addresses carried in operation request messages that have a same identification information, and wherein the identification information is used to identify sources that initiate the operation request messages;
  parsing the message packet to acquire the compressed addresses and the compression algorithm;
  determining, according to the compression algorithm, a decompression algorithm corresponding to the compressed addresses;
  decompressing the compressed addresses according to the decompression algorithm; and
  sending the operation request messages to the second computer component after the compressed addresses have been decompressed, such that the second computer component separately processes the operation request messages according to decompressed addresses.

7. The method according to claim 6, wherein the compressed addresses are addresses obtained after the first computer component combines operation request messages that have the same identification information, carry consecutive addresses, and have a same attribute information of the operation request messages, and then compresses the addresses carried in the operation request messages that have the same identification information, carry consecutive addresses, and have the same attribute information.

8. The method according to claim 6, wherein the operation request messages further carry number information of each operation request message.

9. An apparatus for compressing addresses in operation request messages in a computer system, wherein the computer system comprises a first computer component and a second computer component, the apparatus comprising:
  a receiver configured to receive multiple operation request messages that are sent by a first computer component, wherein each operation request message carries identification information of the first computer component and an address to be accessed in the second computer component, and wherein the identification information used to identify sources that initiate the operation request messages;
  a processor coupled to the receiver and configured to:
    determine a compression algorithm corresponding to the multiple operation request messages according to the addresses carried in the multiple operation request messages that have a same identification information; and,
    compress, according to the compression algorithm, the addresses carried in the multiple operation request messages that have the same identification information; and
  a transmitter coupled to the processor and configured to send the multiple operation request messages to the second computer component after the addresses carried in the multiple operation request messages have been compressed.

10. The apparatus according to claim 9, wherein each operation request message further carries size information of data that is requested to be operated, wherein the processor is further configured to:
  check, according to the identification information, the address, and the size information that are carried in each operation request message, whether operation request messages that have consecutive addresses exist in the multiple operation request messages that have the same identification information;
  check whether attribute information carried in the operation request messages that carry consecutive addresses is completely the same when the operation request messages that have consecutive addresses exist and
  combine the operation request messages that carry consecutive addresses when the attribute information of the operation request messages is the same.

11. The apparatus according to claim 10, wherein the processor is farther configured to construct a message packet, after compressing according to the compression algorithm, addresses carried in the multiple operation request messages that have the same identification information, wherein the message packet comprises a compressed information part and an uncompressed information part, wherein the compressed information part comprises the compressed addresses, stream number information of operation request messages corresponding to the compressed addresses, and the compression algorithm corresponding to the compressed addresses, wherein the uncompressed information part comprises other information carried in each operation request message than the address information and the stream number information, and wherein the transmitter is further configured to send the message packet to the second computer component.

12. The apparatus according to claim 9, wherein the processor is further configured to construct a message packet, after compressing according to the compression algorithm, addresses carried in the multiple operation request messages that have the same identification information, wherein the message packet comprises a compressed information part and an uncompressed information part, wherein the compressed information part comprises the compressed addresses, stream number information of operation request messages corresponding to the compressed addresses, and the compression algorithm corresponding to the compressed addresses, wherein the uncompressed information part comprises other information carried in each operation request message than the address information and the stream number information, and wherein the transmitter is further configured to send the message packet to the second computer component.

13. The apparatus according to claim 9, wherein the operation request messages further carry number information of each operation request message.

14. An apparatus for decompressing address in operation request messages in a computer system, wherein the computer system comprises a first computer component and a second computer component, the apparatus comprising:

a receiver configured to receive a message packet that is sent by an apparatus of compressing addresses in operation request messages in a computer system, wherein the message packet comprises a compressed information part and an uncompressed information part, wherein the compressed information part comprises compressed addresses, identification information of the first computer component corresponding to the compressed addresses, and a compression algorithm corresponding to the compressed addresses, and wherein the uncompressed information part comprises other information carried in each operation request message than address and the identification information, wherein the operation request messages are messages indicating operations that the first computer component requests the second computer component to perform, wherein the compressed addresses are addresses obtained after the first computer component compresses addresses carried in operation request messages that have a same identification information, and wherein the identification information is used to identify sources that initiate the operation request messages;

a processor coupled to the receiver and configured to:
  parse the message packet to acquire the compressed addresses and the compression algorithm;
  determine, according to the compression algorithm, a decompression algorithm corresponding to the compressed addresses; and
  decompress the compressed addresses according to the decompression algorithm; and a transmitter coupled to the processor and configured to send the operation request messages to the second computer component after the compressed addresses have been decompressed, such that the second computer component separately processes the operation request messages according to decompressed addresses.

15. The apparatus according to claim 14, wherein the compressed addresses are addresses obtained after the first computer component combines the operation request messages that have the same identification information, carry consecutive addresses, and have a same attribute information of the operation request messages, and then compresses the addresses carried in the operation request messages that have the same identification information.

16. The apparatus according to claim 15, wherein operation request messages further carry number information, carry consecutive addresses, and have the same attribute information of each operation request message.

17. The apparatus according to claim 14, wherein the operation request messages further carry number information of each operation request message.

* * * * *